(12) United States Patent
Jia et al.

(10) Patent No.: US 11,380,821 B2
(45) Date of Patent: Jul. 5, 2022

(54) LIGHT EMITTING DIODE PACKAGE STRUCTURE

(71) Applicant: LITE-ON OPTO TECHNOLOGY (CHANGZHOU) CO., LTD., Changzhou (CN)

(72) Inventors: Shu-yong Jia, Changzhou (CN); Abner Li, Baiyin (CN); Li Zhang, XiaoGan (CN)

(73) Assignee: LITE-ON OPTO TECHNOLOGY (CHANGZHOU) CO., LTD., Changzhou (CN)

( * ) Notice: Subject to any disclaimer, the term of this patent is extended or adjusted under 35 U.S.C. 154(b) by 52 days.

(21) Appl. No.: 17/034,321

(22) Filed: Sep. 28, 2020

(65) Prior Publication Data

US 2021/0399179 A1    Dec. 23, 2021

(30) Foreign Application Priority Data

Jun. 18, 2020    (CN) .......................... 202010561361.9

(51) Int. Cl.
*H01L 33/50* (2010.01)
*H01L 33/10* (2010.01)
*H01L 33/48* (2010.01)
*H01L 33/46* (2010.01)

(52) U.S. Cl.
CPC ............ *H01L 33/486* (2013.01); *H01L 33/10* (2013.01); *H01L 33/46* (2013.01); *H01L 33/50* (2013.01)

(58) Field of Classification Search
CPC ....... H01L 33/10; H01L 33/50; H01L 33/486; H01L 33/46; H01L 33/60
See application file for complete search history.

(56) References Cited

U.S. PATENT DOCUMENTS

| 8,957,428 | B2* | 2/2015 | Jagt ........................ H01L 33/46 257/88 |
| 2019/0058096 | A1* | 2/2019 | Guo ...................... H01L 33/501 |
| 2019/0109268 | A1* | 4/2019 | Moran .................... H01L 33/58 |
| 2019/0198718 | A1* | 6/2019 | Hashimoto ............. H01L 33/58 |
| 2019/0363227 | A1* | 11/2019 | Luo ........................ H01L 33/60 |

* cited by examiner

*Primary Examiner* — Savitri Mulpuri
(74) *Attorney, Agent, or Firm* — Li & Cai Intellectual Property (USA) Office

(57) ABSTRACT

A light emitting diode package structure includes a substrate, a light emitting unit, a wavelength conversion layer, and a reflective structure. The light emitting unit and the reflective structure are disposed on a mounting surface of the substrate. The wavelength conversion layer is disposed on the light emitting unit. The wavelength conversion layer has a light input surface, a top light output surface opposite to the light input surface, and a side light output surface connecting the light input surface and the top light output surface. The reflective structure surrounds the light emitting unit and the wavelength conversion layer. The reflective structure has a top reflecting surface located on a top of the reflective structure, and a height position of the top reflecting surface is higher than a height position of the light input surface and lower than a height position of the top light output surface.

17 Claims, 8 Drawing Sheets

LIGHT EMITTING DIODE PACKAGE STRUCTURE

CROSS-REFERENCE TO RELATED PATENT APPLICATION

This application claims the benefit of priority to China Patent Application No. 202010561361.9, filed on Jun. 18, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a light emitting diode package structure.

BACKGROUND OF THE DISCLOSURE

A light emitting diode (LED) has advantages of low energy consumption, long service life, and good luminous efficiency. In addition, the LED can withstand repeated switching operations. Therefore, fluorescent lamps on the market are gradually replaced with the LED to serve as a light source. Generally, material and metal electrodes of the LED are easily oxidized by being in contact with water vapor and oxygen. Accordingly, the LED is usually packaged to prevent water vapor and oxygen from coming in contact with the LED.

Referring to FIG. 12, a conventional LED package structure is shown. The LED serves as a light emitting unit 20'. The light emitting unit 20' is disposed on a substrate 10'. A wavelength conversion layer 40' is disposed on the light emitting unit 20'. Accordingly, when a light generated by the light emitting unit 20' passes through the wavelength conversion layer 40', color of the light is converted into another color. An adhesive layer 30' can be disposed between the light emitting unit 20' and the wavelength conversion layer 40'. A reflective structure 50' is disposed on the substrate 10' and surrounds the light emitting unit 20' and the wavelength conversion layer 40'. A top reflecting surface 51' of the reflective structure 50' is flush with a top light output surface 42' of the wavelength conversion layer 40'.

However, in the LED package structure shown in FIG. 12, an entire side light output surface 43' of the wavelength conversion layer 40' and an entire peripheral surface 22' of the light emitting unit 20' are in contact with the reflective structure 50', so that it is not possible for the light to be emitted out from the side light output surface 43' of the wavelength conversion layer 40' and the entire peripheral surface 22' of the light emitting unit 20'. Accordingly, the luminous efficiency of the LED package structure is negatively affected, and a yellow-ring phenomenon occurs easily.

FIG. 13 is a simulation diagram of a light distribution curve of the LED package structure shown in FIG. 12. Referring to FIG. 13, differences of light intensities at different angles of the conventional LED package structure are great; that is, a light uniformity of the conventional LED package structure is poor.

Referring to FIG. 14, another conventional LED package structure is shown. The conventional LED package structure shown in FIG. 14 is similar to the conventional LED package structure shown in FIG. 12. The conventional LED package structure shown in FIG. 14 further includes a space-filling material 70', and the light emitting unit 20' includes a plurality of LED chips. The plurality of LED chips are spaced apart from one another. Therefore, the space-filling material 70' is filled not only between the light emitting unit 20' and the reflective structure 50', but also between the plurality of LED chips.

Similarly, in the LED package structure shown in FIG. 14, a top reflecting surface 51' of the reflective structure 50' is flush with a top light output surface 42' of the wavelength conversion layer 40'. Therefore, the LED package structure shown in FIG. 14 also has problems of poor luminous efficiency and the yellow-ring phenomenon.

Accordingly, the conventional LED package structure needs to be improved so as to maintain the advantage of being small in size and enhance the luminous efficiency of the LED after packaging.

SUMMARY OF THE DISCLOSURE

In response to the above-referenced technical inadequacies, the present disclosure provides an LED package structure.

In one aspect, the present disclosure provides an LED package structure. The LED package structure includes a substrate, a light emitting unit, a wavelength conversion layer, and a reflective structure. The substrate has a mounting surface. The light emitting unit is disposed on the mounting surface. The light emitting unit had a light emitting surface. The wavelength conversion layer is disposed on the light emitting unit. The wavelength conversion layer has a light input surface facing toward the light emitting surface, a top light output surface opposite to the light input surface, and a side light output surface connecting the light input surface and the top light output surface. The reflective structure is disposed on the mounting surface. The reflective structure has an inner reflecting surface surrounding the light emitting unit and the wavelength conversion layer. The reflective structure has a top reflecting surface located on a top of the reflective structure and connected with the inner reflecting surface. The top reflecting surface is located at a higher position than that of the light input surface and is located at a lower position than that of the top light output surface.

In certain embodiments, the top reflecting surface of the reflective structure is parallel to the mounting surface.

In certain embodiments, the top reflecting surface of the reflective structure is tilted at a predetermined angle relative to the mounting surface. The predetermined angle is larger than 0 and smaller than 90 degrees.

In certain embodiments, the predetermined angle ranges from 25 to 65 degrees.

In certain embodiments, the light emitting diode package structure further includes a light-permeable body. The light-permeable body is disposed on the top reflecting surface and in contact with the side light output surface of the wavelength conversion layer.

In certain embodiments, a refractive index of the light-permeable body ranges between a refractive index of the wavelength conversion layer and a refractive index of the air.

In certain embodiments, a light transmittance of the light-permeable body is higher than or equal to 90%.

In certain embodiments, the light-permeable body has a top surface that is flush with the top light output surface of the wavelength conversion layer.

In certain embodiments, an area of the light emitting surface is larger than an area of the light input surface.

In certain embodiments, the wavelength conversion layer has an outer end that is limited in position on the reflective structure.

In certain embodiments, the reflective structure encloses a peripheral surface of the light emitting unit.

In certain embodiments, the light emitting unit includes a plurality of light emitting diodes spaced apart from one another.

In certain embodiments, the light emitting unit is separated from the reflective structure by at least one gap.

In certain embodiments, the light emitting diode package structure further includes a space-filling material that is filled in the at least one gap.

In certain embodiments, the light emitting unit includes one light emitting diode chip or a plurality of light emitting diode chips. Each of the light emitting diode chip is a horizontal light emitting diode chip, a vertical light emitting diode chip, or a flip-chip light emitting diode chip.

Therefore, by virtue of "the height position of the top reflecting surface is higher than the height position of the light input surface and lower than the height position of the top light output surface", the luminous efficiency of the LED package structure of the present disclosure can be enhanced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
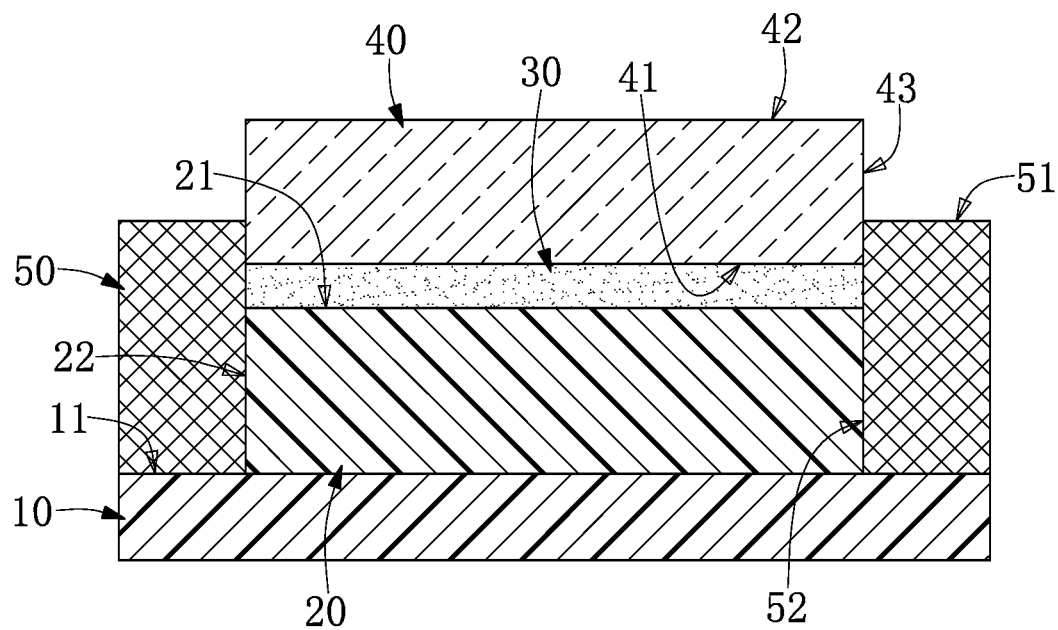
FIG. 1 is a cross-sectional side view of an LED package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

To overcome a disadvantage of a conventional LED after packaging, which is poor luminous efficiency, the present disclosure provides an LED package structure. In the LED package structure of the present disclosure, a reflective structure surrounds a wavelength conversion layer without completely obstructing a side light output surface of the wavelength conversion layer.

Therefore, an amount of light absorbed by the reflective structure can be reduced so that the luminous efficiency of the LED package structure can be enhanced.

Referring to FIG. 1, the LED package structure of the present disclosure includes: a substrate 10, a light emitting unit 20, an adhesive layer 30, a wavelength conversion layer 40, and a reflective structure 50.

The substrate 10 has a mounting surface 11.

The light emitting unit 20 is disposed on the mounting surface 11 of the substrate 10. The light emitting unit 20 has a light emitting surface 21 and a peripheral surface 22. The light emitting surface 21 is located on a side of the light emitting unit 20 opposite to the substrate 10. The peripheral surface 22 is connected with the light emitting surface 21. The light emitting unit 20 can include one or more LED chips. The LED chip can be, but not limited to, a horizontal LED chip, a vertical LED chip, or a flip-chip LED chip.

The adhesive layer 30 is disposed on the light emitting unit 20. The adhesive layer 30 is an optional element. Whether or not the adhesive layer 30 is disposed can be decided according to an adhesive strength between the light emitting unit 20 and the wavelength conversion layer 40. The adhesive layer 30 is a transparent layer. Specifically, a material of the adhesive layer 30 includes a silicone resin or an epoxy resin. In other words, the adhesive layer 30 allows a light generated by the light emitting unit 20 to pass through.

The wavelength conversion layer 40 can be directly disposed on the light emitting unit 20 or indirectly disposed on the light emitting unit 20 via the adhesive layer 30, so that when the light generated by the light emitting unit 20 passes through the wavelength conversion layer 40, a color of the light can be converted into an ideal color. The wavelength conversion layer 40 has a light input surface 41 facing toward the light emitting surface 21, a top light output surface 42 opposite to the light input surface 41, and a side light output surface 43 connecting the light input surface 41 and the top light output surface 42. Specifically, the light input surface 41 of the wavelength conversion layer 40 faces toward the light emitting surface 21 of the light emitting unit 20. Therefore, the light generated by the light emitting unit 20 can enter the wavelength conversion layer 40 via the light input surface 41, and then the light, after passing through the wavelength conversion layer 40, can be emitted from the top light output surface 42 or the side light output surface 43. In addition, in some embodiments not shown, an area of the top light output surface 42 of the wavelength conversion layer 40 is slightly larger than an area of the light input surface 41 so as to further enhance the luminous efficiency of the LED package structure.

The reflective structure 50 is disposed on the mounting surface 11 of the substrate 10. The reflective structure 50 has a top reflecting surface 51 and an inner reflecting surface 52 that are connected with each other. The top reflecting surface 51 of the reflective structure 50 can be a roughened surface. The inner reflecting surface 52 of the reflective structure 50 surrounds the light emitting unit 20, the adhesive layer 30, and the wavelength conversion layer 40, without completely obstructing the side light output surface 43 of the wavelength conversion layer 40. Accordingly, the light generated by the light emitting unit 20 will not be excessively reflected by the reflective structure 50, so that the luminous efficiency of the LED package structure can be enhanced and a yellow-ring phenomenon can be reduced. Therefore, the LED package structure of the present disclosure is advantageous when being applied in automobile lamps.

The following description will illustrate specific structures in each embodiment in more detail.

First Embodiment

Referring to FIG. 1, a shape of the light input surface 41 of the wavelength conversion layer 40 corresponds to a shape of the light emitting surface 21 of the light emitting unit 20. In addition, an area of the light input surface 41 is equal to an area of the light emitting surface 21. In the first embodiment, the adhesive layer 30 is disposed between the light emitting unit 20 and the wavelength conversion layer 40.

The top reflecting surface 51 of the reflective structure 50 is located at a position higher than that of the light input surface 41 and is located at a position lower than that of the top light output surface 42. Accordingly, the light generated by the light emitting unit 20 can be dispersed from the side light output surface 43 of the wavelength conversion layer 40 so that the luminous efficiency of the LED package structure can be enhanced and the yellow-ring phenomenon can be reduced.

In the first embodiment, the top reflecting surface 51 of the reflective structure 50 is parallel to the mounting surface 11 of the substrate 10, but is not limited thereto. In other embodiments, the top reflecting surface 51 of the reflective structure 50 can be tilted at a predetermined angle relative to the mounting surface 11.

The light emitting unit 20, the adhesive layer 30, and the wavelength conversion layer 40 are surrounded by the inner reflecting surface 52 of the reflective structure 50. Therefore, the inner reflecting surface 52 of the reflective structure 50 contacts the peripheral surface 22 of the light emitting unit 20. It should be noted that the inner reflecting surface 52 of the reflective structure 50 contacts a part of the side light output surface 43 of the wavelength conversion layer 40, but the side light output surface 43 of the wavelength conversion layer 40 is not completely obstructed by the inner reflecting surface 52 of the reflective structure 50. Accordingly, the LED package structure can have a better luminous efficiency. Further, in the first embodiment, the peripheral surface 22 of the light emitting unit 20 is enclosed by the reflective structure 50; that is, the peripheral surface 22 of the light emitting unit 20 is directly encapsulated by the reflective structure 50. However, the present disclosure is not limited thereto. In other embodiments mentioned below, the reflective structure 50 is separated from the peripheral surface 22 of the light emitting unit 20 by a gap. Such variations are still within the scope of the present disclosure.

In the first embodiment, the inner reflecting surface 52 of the reflective structure 50 is perpendicular to the mounting surface 11 of the substrate 10, but it is not limited thereto. In other embodiments, the inner reflecting surface 52 of the reflective structure 50 can be tilted at an angle relative to the mounting surface 11 of the substrate 10 so as to meet specification requirements of different products.

Second Embodiment

Figure 2:
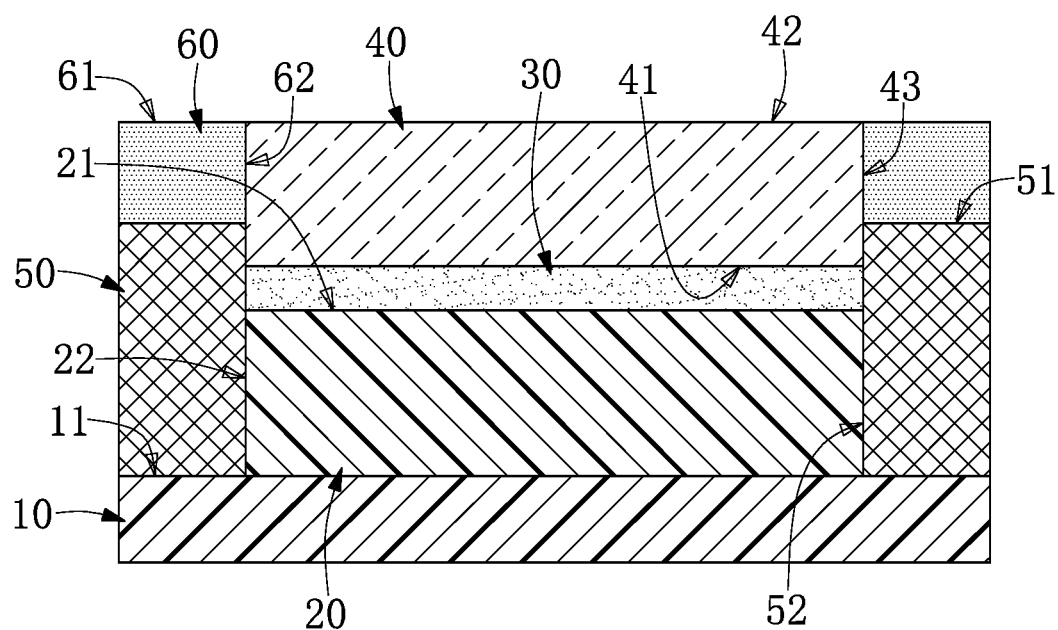
FIG. 2 is a cross-sectional side view of the LED package structure according to a second embodiment of the present disclosure.

Referring to FIG. 2, the LED package structure of the second embodiment is similar to the LED package structure of the first embodiment. The difference is that the LED package structure of the second embodiment further includes a light-permeable body 60. The light-permeable body 60 is disposed on the top reflecting surface 51 of the reflective structure 50 and contacts the side light output surface 43 of the wavelength conversion layer 40. Specifically, a concave region is formed between the top reflecting surface 51 of the reflective structure 50 and the side light output surface 43 of the wavelength conversion layer 40. The light-permeable body 60 is filled in the concave region.

A material of the light-permeable body 60 includes a silicone resin or an epoxy resin. A refractive index of the light-permeable body 60 ranges between a refractive index of the wavelength conversion layer 40 and a refractive index of the air. Accordingly, the light can be converged by the light-permeable body 60, and the light-permeable body 60 can have a similar function as a light guide component. Specifically, a light transmittance of the light-permeable body 60 needs to be greater than or equal to 90%, and preferably the material of the light-permeable body 60 does not contain light diffusing particles so as to achieve a good light guiding effect.

Specifically, the light-permeable body 60 has a top surface 61 and a side surface 62. The top surface 61 is flush with the top light output surface 42 of the wavelength conversion layer 40. The side surface 62 contacts the side light output surface 43 of the wavelength conversion layer 40. Therefore, the light emitted from the side light output surface 43 can be converged by the light-permeable body 60 so that the light-permeable body 60 achieves the good light guiding effect. Given that the refractive index of the light-permeable body 60 ranges between the refractive index of the wavelength conversion layer 40 and the refractive index of the air, a phenomenon of total internal reflection can be prevented when the light is emitted from the side light output surface 43 of the wavelength conversion layer 40. Therefore, compared to the first embodiment, the light-permeable body 60 of the second embodiment can prevent the phenomenon of the total internal reflection, thereby enhancing the luminous efficiency of the LED package structure, and reducing the yellow-ring phenomenon.

Third Embodiment

Figure 3:
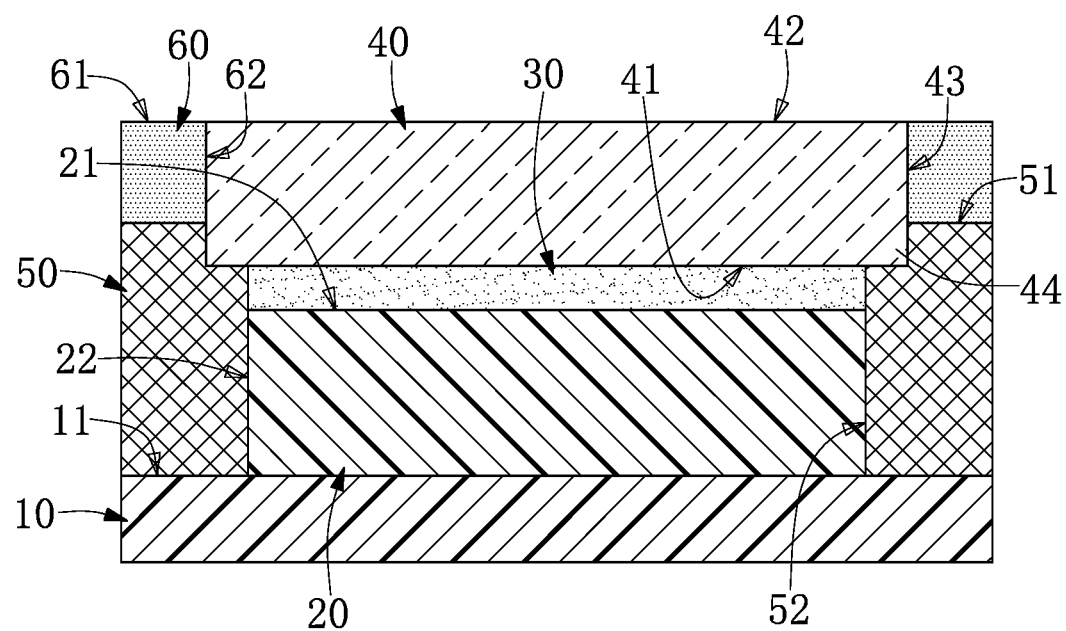
FIG. 3 is a cross-sectional side view of the LED package structure according to a third embodiment of the present disclosure.

Referring to FIG. 3, the LED package structure of the third embodiment is similar to the LED package structure of the second embodiment. The difference is that the area of the light input surface 41 of the wavelength conversion layer 40 is larger than the area of the light emitting surface 21 of the light emitting unit 20, so that an illumination area of the LED package structure can be enlarged and the luminous efficiency of the LED package structure can be enhanced.

Specifically, the light emitting surface 21 of the light emitting unit 20 is completely covered by the light input surface 41 of the wavelength conversion layer 40. An outer end 44 of the wavelength conversion layer 40 is limited in position on the reflective structure 50. In other words, a retaining groove is concavely formed at a junction extending from the top reflecting surface 51 and the inner reflecting surface 52 of the reflective structure 50. The outer end 44 is located at a junction between the light input surface 41 and the side light output surface 43 of the wavelength conversion layer 40, and can be disposed in the retaining groove.

Fourth Embodiment

Figure 4:
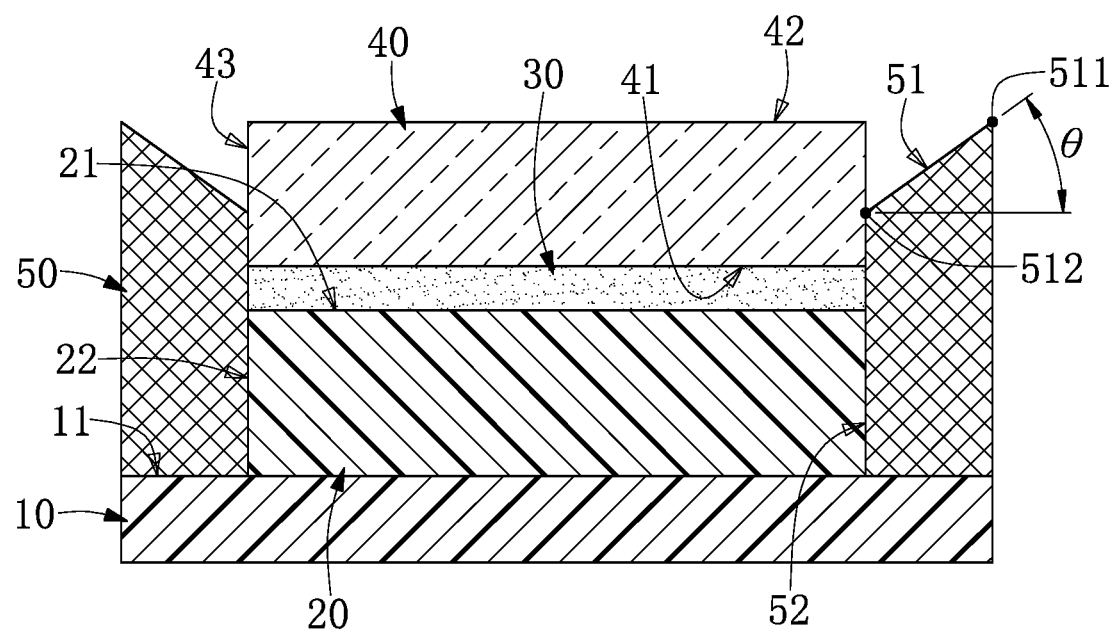
FIG. 4 is a cross-sectional side view of the LED package structure according to a fourth embodiment of the present disclosure.

Referring to FIG. 4, the LED package structure of the fourth embodiment is similar to the LED package structure of the first embodiment. The difference is that the top reflecting surface 51 of the reflective structure 50 is not parallel to the mounting surface 11 of the substrate 10. The top reflecting surface 51 is tilted at a predetermined angle θ relative to the mounting surface 11, and faces toward the side light output surface 43 of the wavelength conversion layer 40. Accordingly, the light emitted from the side light output surface 43 can be reflected by the top reflecting surface 51, so that the luminous efficiency of the LED package structure can be enhanced. Specifically, the predetermined angle θ ranges from 0 to lower than 90 degrees; preferably, the predetermined angle θ ranges from 25 to 65 degrees.

Fifth Embodiment

Figure 5:
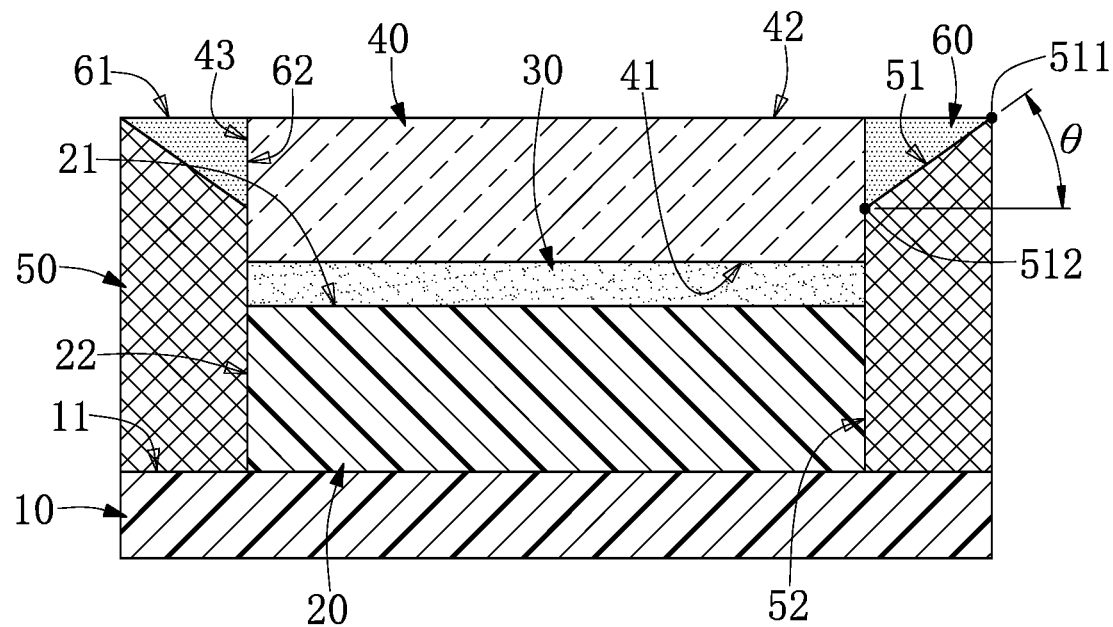
FIG. 5 is a cross-sectional side view of the LED package structure according to a fifth embodiment of the present disclosure.

Referring to FIG. 5, the LED package structure of the fifth embodiment is similar to the LED package structure of the fourth embodiment. The difference is that the LED package structure of the fifth embodiment further includes the light-permeable body 60 (previously mentioned in the second embodiment). The light-permeable body 60 is disposed on the top reflecting surface 51 of the reflective structure 50 and filled in the concave region formed by the top reflecting surface 51 and the side light output surface 43. The material of the light-permeable body 60, the refractive index of the light-permeable body 60, and the specific structure of the light-permeable body 60 in the fifth embodiment are the same with those in the second embodiment and will not be repeated herein.

In each of the second embodiment, the third embodiment, and the fifth embodiment, there is a different relative arrangement among the wavelength conversion layer 40, the reflective structure 50, and the light-permeable body 60. Accordingly, the LED package structure can emit lights with various light forms so as to meet different requirements. For example, the LED package structure can be applied in automobile lamps of different types, such as a headlight, a direction light, a warning light, or a rear light. However, no matter how the relative arrangement is adjusted among the wavelength conversion layer 40, the reflective structure 50, and the light-permeable body 60, the LED package structure can have good luminous efficiency, so long as the wavelength conversion layer 40 is surrounded by the reflective structure 50 and the side light output surface 43 is not completely obstructed by the reflective structure 50.

Sixth Embodiment

Figure 6:
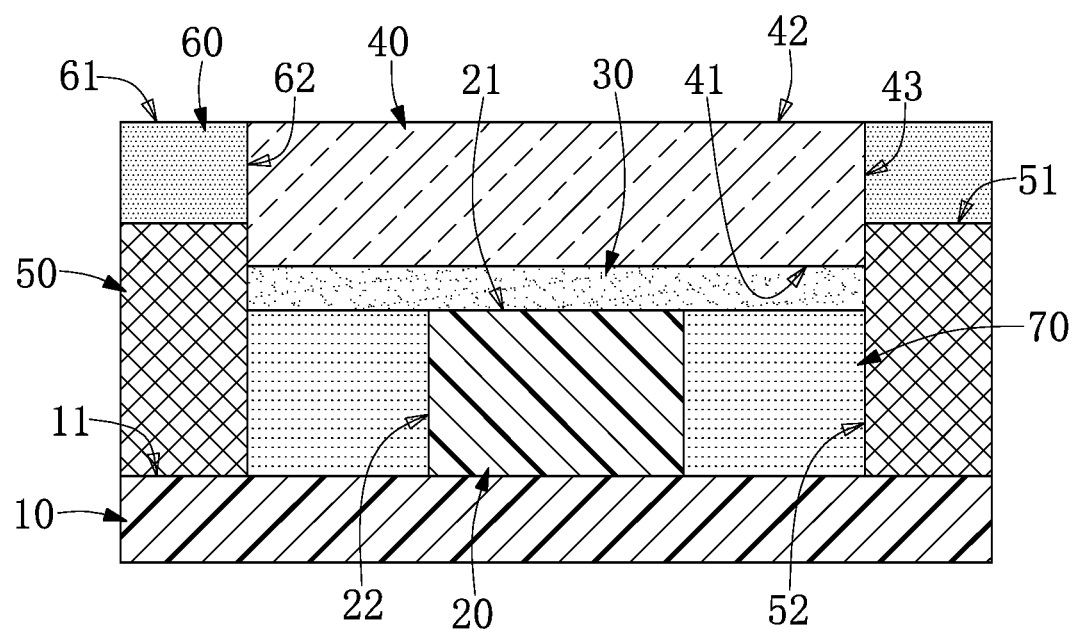
FIG. 6 is a cross-sectional side view of the LED package structure according to a sixth embodiment of the present disclosure.

Referring to FIG. 6, the LED package structure of the sixth embodiment is similar to the LED package structure of the second embodiment. The difference is that the LED package structure of the sixth embodiment further includes a space-filling material 70. The space-filling material 70 is a transparent material so as to allow the light generated by the light emitting unit 20 to pass through.

Specifically, at least one gap is formed between the light emitting unit 20 and the reflective structure 50. The space-filling material 70 is filled in the at least one gap. Further, the space-filling material 70 and the light emitting unit 20 are covered by the adhesive layer 30. In other words, the peripheral surface 22 of the light emitting unit 20 does not contact the inner reflecting surface 52 of the reflective structure 50. The light emitting unit 20 is surrounded by the space-filling material 70, and the peripheral surface 22 of the light emitting unit 20 and the inner reflecting surface 52 of the reflective structure 50 are both in contact with the space-filling material 70.

Seventh Embodiment

Figure 7:
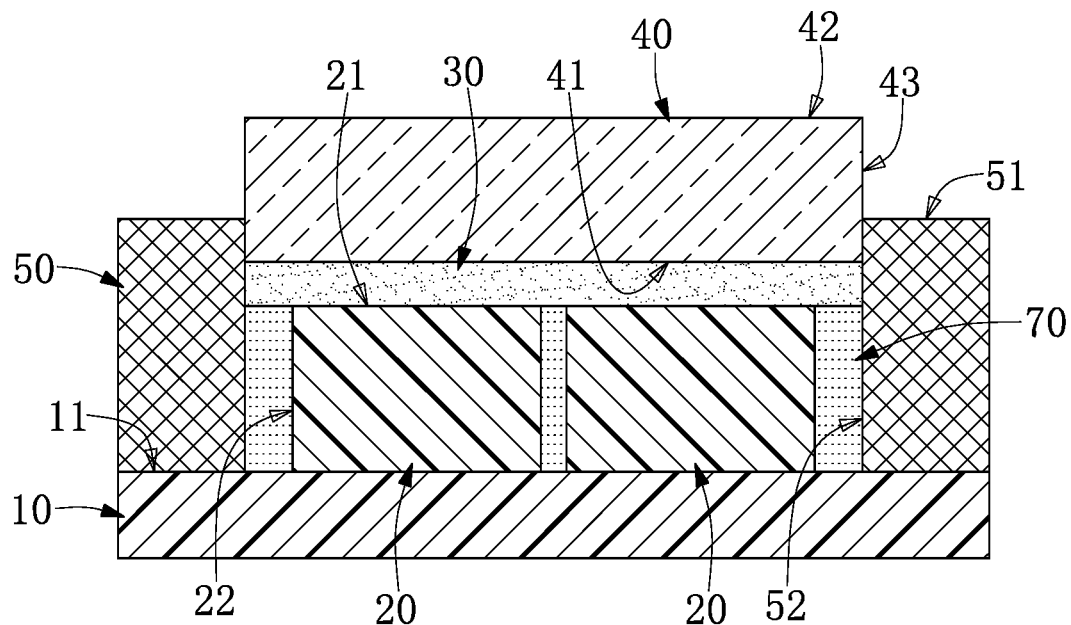
FIG. 7 is a cross-sectional side view of the LED package structure according to a seventh embodiment of the present disclosure.

Referring to FIG. 7, the LED package structure of the seventh embodiment is similar to the LED package structure of the first embodiment. The difference is that the LED package structure of the seventh embodiment further includes the space-filling material 70 (previously mentioned in the sixth embodiment), and the light emitting unit 20 has a plurality of LEDs.

Specifically, the plurality of LEDs are spaced apart from one another. Therefore, the space-filling material 70 is not only filled in the at least one gap but also filled among the plurality of LEDs.

Eighth Embodiment

Figure 8:
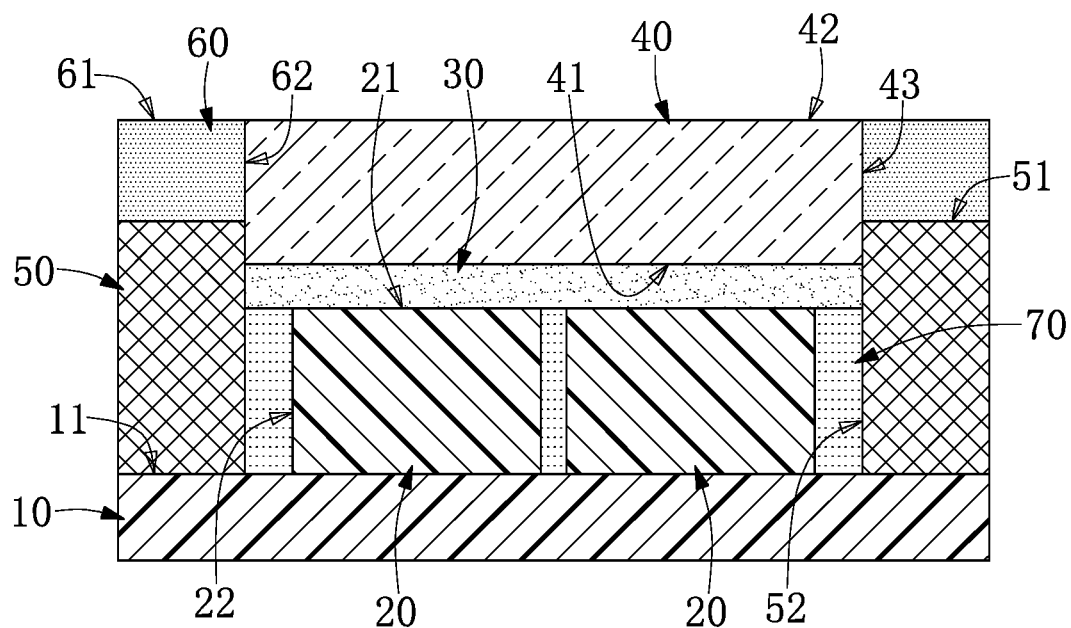
FIG. 8 is a cross-sectional side view of the LED package structure according to an eighth embodiment of the present disclosure.

Referring to FIG. 8, the LED package structure of the eighth embodiment is similar to the LED package structure of the seventh embodiment. The difference is that the LED package structure of the eighth embodiment further includes the light-permeable body 60 (previously mentioned in the second embodiment). The light-permeable body 60 is disposed on the top reflecting surface 51 of the reflective structure 50 and filled in the concave region formed by the top reflecting surface 51 and the side light output surface 43. The material of the light-permeable body 60, the refractive index of the light-permeable body 60, and the specific structure of the light-permeable body 60 in the eighth embodiment are the same with those in the second embodiment and will not be repeated herein.

Ninth Embodiment

Figure 9:
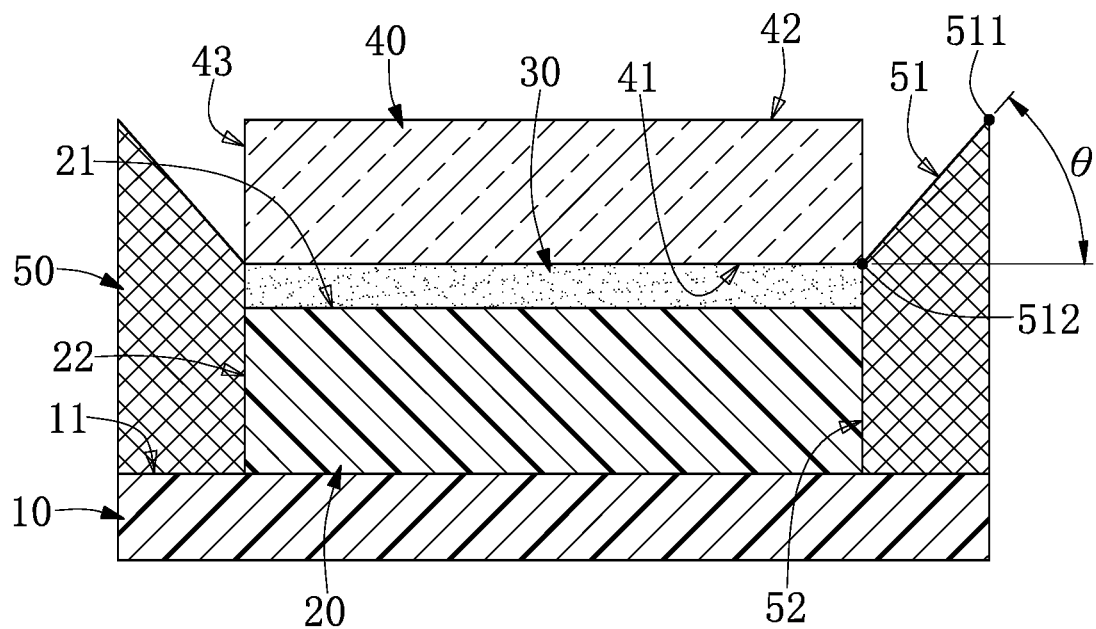
FIG. 9 is a cross-sectional side view of the LED package structure according to a ninth embodiment of the present disclosure.

Referring to FIG. 9, the LED package structure of the ninth embodiment is similar to the LED package structure of the fourth embodiment. The difference is that the top reflecting surface 51 of the reflective structure 50 has an upper edge 511 and a lower edge 512 that are opposite to each other. A height position of the upper edge 511 is the same as a height position of the top light output surface 42, and a height position of the lower edge 512 is the same as a height position of the light input surface 41. In other words, the wavelength conversion layer 40 is still surrounded by the reflective structure 50, but the side light output surface 43 of the wavelength conversion layer 40 is completely exposed to an external environment.

In the ninth embodiment, although the height position of the top reflecting surface 51 is not higher than the height position of the light input surface 41, the top reflecting surface 51 is tilted at the predetermined angle θ relative to the mounting surface 11, so that the LED package structure of the ninth embodiment still conforms to the relative arrangement of having the wavelength conversion layer 40 surrounded by the reflective structure 50 but the side light output surface 43 of the wavelength conversion layer 40 being not completely obstructed by the reflective structure 50. Therefore, in the ninth embodiment, the luminous efficiency of the LED package structure still can be enhanced.

Tenth Embodiment

Figure 10:
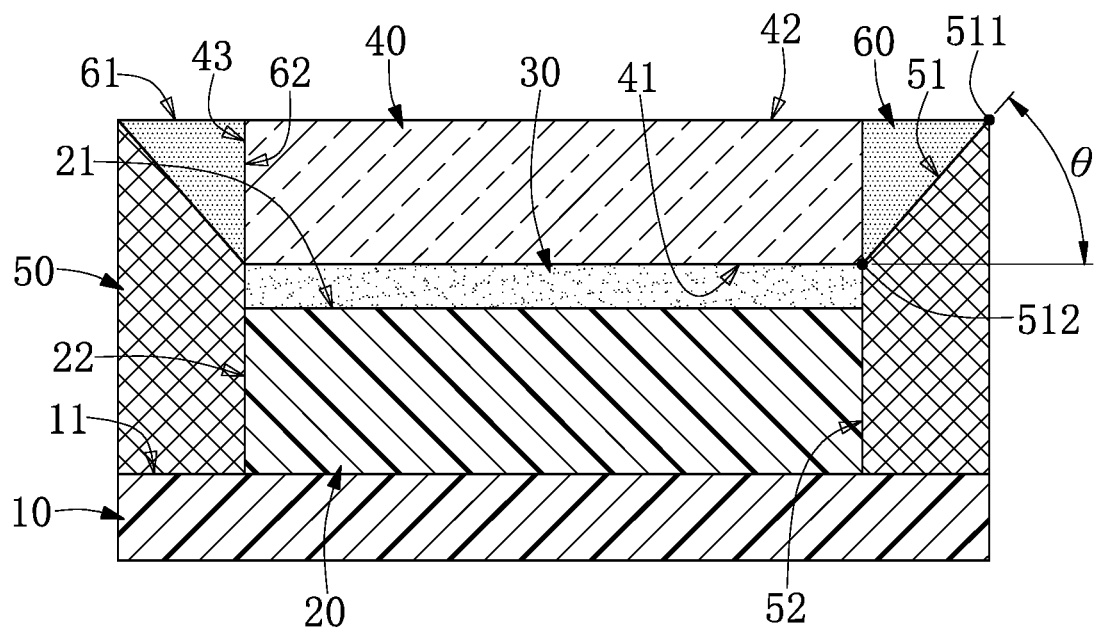
FIG. 10 is a cross-sectional side view of the LED package structure according to a tenth embodiment of the present disclosure.

Referring to FIG. 10, the LED package structure of the tenth embodiment is similar to the LED package structure of the ninth embodiment. The difference is that the LED package structure of the tenth embodiment further includes the light-permeable body 60 (previously mentioned in the second embodiment). The light-permeable body 60 is disposed on the top reflecting surface 51 of the reflective structure 50 and filled in the concave region formed by the top reflecting surface 51 and the side light output surface 43. The material of the light-permeable body 60, the refractive index of the light-permeable body 60, and the specific structure of the light-permeable body 60 in the tenth embodiment are the same with those in the second embodiment and will not be repeated herein.

To prove that the LED package structure of the present disclosure has a better luminous efficiency, radiance and luminance of the LED package structure of the present disclosure (in Examples 1 to 3) and radiance and luminance of the conventional LED package structure (in Comparative Examples 1 and 2) are measured and listed in Table 1, respectively.

Figure 13:
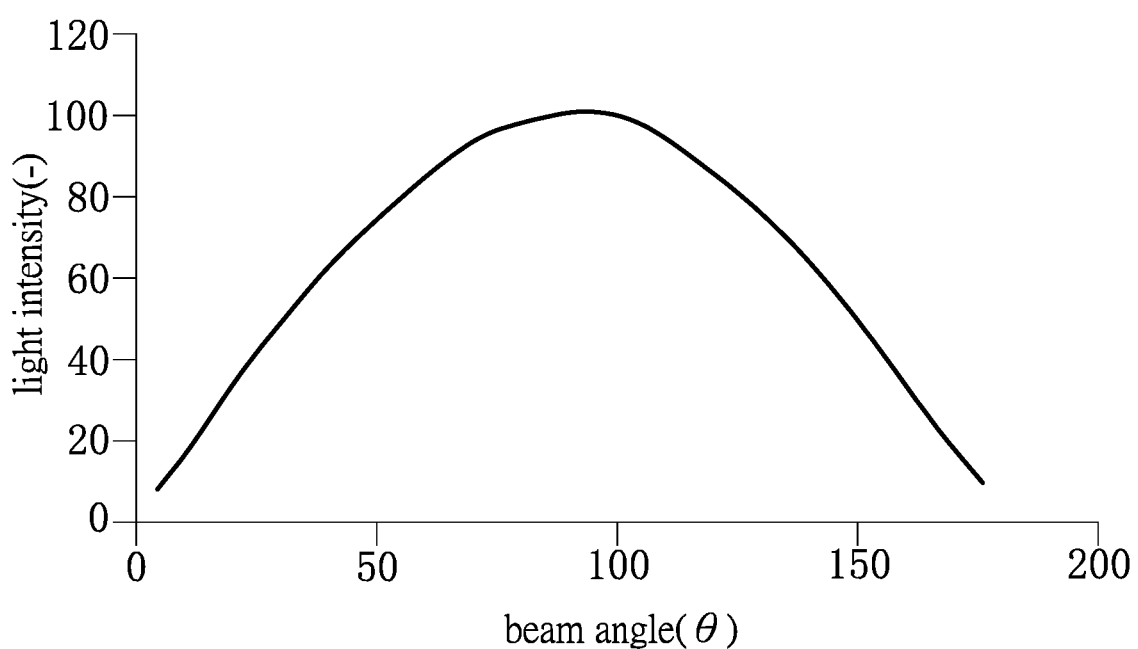
FIG. 13 is a simulation diagram of a light distribution curve of the conventional LED package structure shown in FIG. 12.
Figure 14:
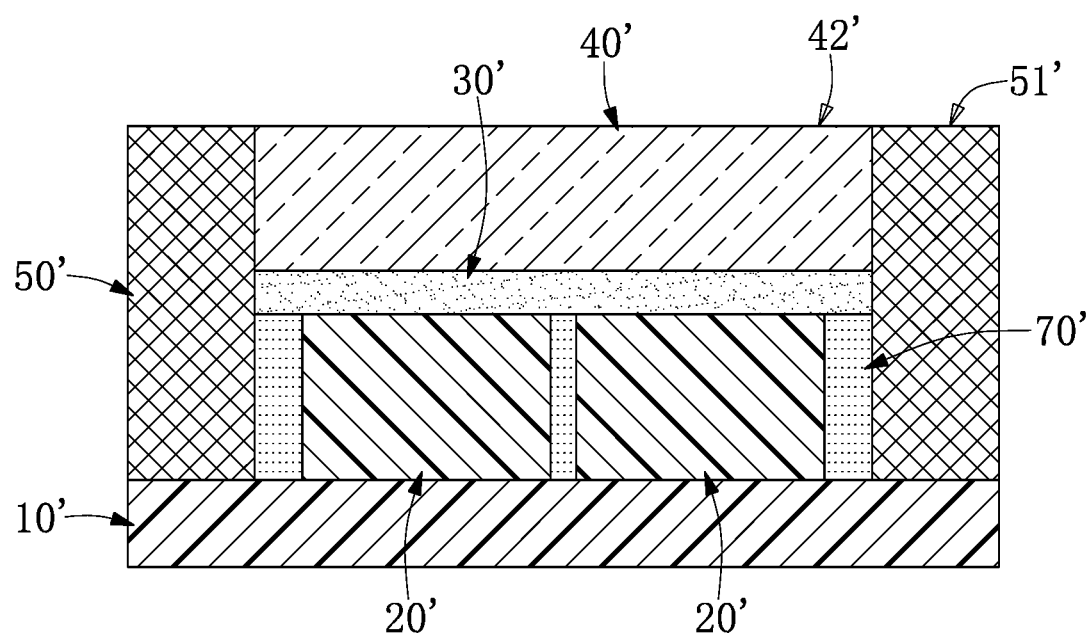
FIG. 14 is a cross-sectional side view of another conventional LED package structure.

The LED package structure of Examples 1 and 2 are respectively corresponding to the LED package structure of the first embodiment (FIG. 1) and the second embodiment (FIG. 2). In each of Examples 1 and 2, a height difference (Δh) between the top reflecting surface 51 and the top light output surface 42 is 130 μm. The LED package structure of Comparative Example 1 corresponds to the LED package structure shown in FIG. 13. In Comparative Example 1, a height difference (Δh) between the top reflecting surface 51' and the top light output surface 42' is 0 μm. That is, the top reflecting surface 51' is flush with the top light output surface 42'.

The LED package structure of Example 3 corresponds to the LED package structure of the first embodiment (FIG. 1). In Example 3, a height difference (Δh) between the top reflecting surface 51 and the top light output surface 42 is 150 μm. The LED package structure of Comparative Example 2 corresponds to the LED package structure shown in FIG. 13. In Comparative Example 2, a height difference (Δh) between the top reflecting surface 51' and the top light output surface 42' is 0 μm. That is, the top reflecting surface 51' is flush with the top light output surface 42'.

TABLE 1

| LED package structure | Property | | |
| --- | --- | --- | --- |
| | Δh (μm) | Radiance (watt) | Luminance (lm) |
| Example 1 | 130 | 0.91 | 367.1 |
| Example 2 | 130 | 0.93 | 375.3 |
| Comparative Example 1 | 0 | 0.83 | 357.4 |
| Example 3 | 150 | — | 376 |
| Comparative Example 2 | 0 | — | 322 |

According to Table 1, radiances and luminances of Examples 1 to 3 are higher than radiances and luminances of Comparative Examples 1 and 2. Therefore, the relative arrangement of having the wavelength conversion layer 40 surrounded by the reflective structure 50 but the side light output surface 43 of the wavelength conversion layer 40 being not completely obstructed by the reflective structure 50 can enhance the luminous efficiency of the LED package structure.

In addition, in order to quantify the enhancement of brightness between Examples and Comparative Examples, a brightness-enhanced ratio is calculated by dividing a difference of brightness between Example and Comparative Example by the brightness of Comparative Example. Based on the brightness of Comparative Example 1, the brightness-enhanced ratios of Examples 1 and 2 respectively are 2.7% and 5.0%. Based on the brightness of Comparative Example 2, the brightness-enhanced ratio of Example 3 is 16.8%.

Figure 11:
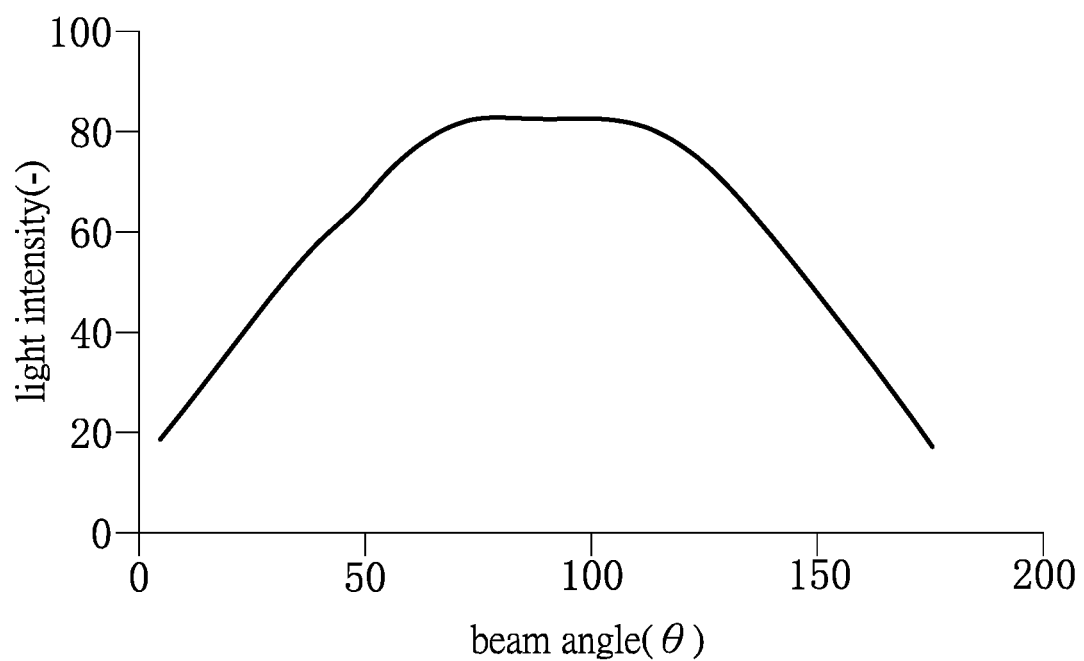
FIG. 11 is a simulation diagram of a light distribution curve of the LED package structure according to the first embodiment of the present disclosure.
Figure 12:
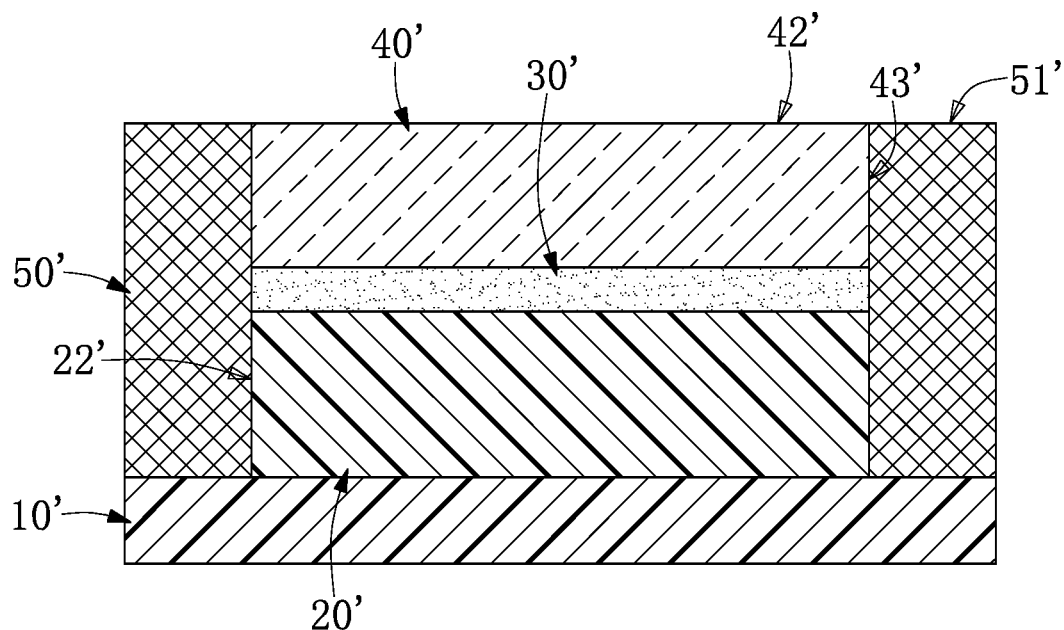
FIG. 12 is a cross-sectional side view of a conventional LED package structure.

Moreover, the LED package structure of the present disclosure not only has a good luminous efficiency but also has a uniform light distribution curve. Referring to FIG. 11, a simulation diagram of light distribution curve of the LED package structure according to the first embodiment (FIG. 1) of the present disclosure is shown. According to FIG. 11, the LED package structure of the present disclosure has a wider beam angle and the differences of light intensities at different angles are small. Accordingly, a yellow-ring phenomenon of the LED package structure can be reduced, and the LED package structure can be applied in various fields, especially in a field of automobile lamps.

In conclusion, by virtue of "the top reflecting surface 51 is located at a position higher than that of the light input surface 41 and is located at a position lower than that of the top light output surface 42", the luminous efficiency of the LED package structure of the present disclosure can be enhanced.

Further, by virtue of "the LED package structure of the present disclosure further includes a light-permeable body 60", the light can be converged by the light-permeable body 60.

Further, by virtue of "the refractive index of the light-permeable body 60 ranges between the refractive index of the wavelength conversion layer 40 and the refractive index of the air", the light can be converged by the light-permeable body 60.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting diode package structure, comprising:
    a substrate having a mounting surface;
    a light emitting unit disposed on the mounting surface, the light emitting unit having a light emitting surface;
    a wavelength conversion layer disposed on the light emitting unit, the wavelength conversion layer having a light input surface facing the light emitting surface, a top light output surface opposite to the light input surface, and a side light output surface connected to the light input surface and the top light output surface;
    a reflective structure disposed on the mounting surface, the reflective structure having an inner reflecting surface surrounding the light emitting unit and the wavelength conversion layer and a top reflecting surface located on a top thereof and connected to the inner reflecting surface;
    wherein the side light output surface of the wavelength conversion layer is not completely obstructed by the inner reflecting surface of the reflective structure;
    wherein the top reflecting surface is located at a higher position than that of the light input surface, and is located at a lower position than that of the top light output surface.

2. The light emitting diode package structure according to claim 1, wherein the top reflecting surface of the reflective structure is parallel to the mounting surface.

3. The light emitting diode package structure according to claim 1, wherein the top reflecting surface of the reflective structure is tilted at a predetermined angle relative to the mounting surface, and the predetermined angle is larger than 0 degrees and smaller than 90 degrees.

4. The light emitting diode package structure according to claim 3, wherein the predetermined angle ranges from 25 degrees to 65 degrees.

5. The light emitting diode package structure according to claim 1, further comprising a light-permeable body being disposed on the top reflecting surface and in contact with the side light output surface of the wavelength conversion layer.

6. The light emitting diode package structure according to claim 5, wherein a refractive index of the light-permeable body ranges between a refractive index of the wavelength conversion layer and a refractive index of air.

7. The light emitting diode package structure according to claim 5, wherein a light transmittance of the light-permeable body is higher than or equal to 90%.

8. The light emitting diode package structure according to claim 5, wherein the light-permeable body has a top surface that is flush with the top light output surface of the wavelength conversion layer.

9. The light emitting diode package structure according to claim 1, wherein an area of the light emitting surface is larger than an area of the light input surface.

10. The light emitting diode package structure according to claim 1, wherein the wavelength conversion layer has an outer end that is limited in position on the reflective structure.

11. The light emitting diode package structure according to claim 1, wherein the reflective structure encloses a peripheral surface of the light emitting unit.

12. The light emitting diode package structure according to claim 1, wherein the light emitting unit includes a plurality of light emitting diodes spaced apart from one another.

13. The light emitting diode package structure according to claim 1, wherein the light emitting unit is separated from the reflective structure by at least one gap.

14. The light emitting diode package structure according to claim 13, further comprising a space-filling material that is filled in the at least one gap.

15. The light emitting diode package structure according to claim 12, wherein the light emitting unit is separated from the reflective structure by at least one gap.

16. The light emitting diode package structure according to claim 15, further comprising a space-filling material that is filled in the at least one gap.

17. The light emitting diode package structure according to claim 1, wherein the light emitting unit includes one or more light emitting diode chips, and the light emitting diode chip is a horizontal light emitting diode chip, a vertical light emitting diode chip, or a flip-chip light emitting diode chip.

* * * * *